United States Patent
Kerns et al.

(10) Patent No.: US 7,324,363 B2
(45) Date of Patent: Jan. 29, 2008

(54) SPICE OPTIMIZED FOR ARRAYS

(75) Inventors: Kevin J. Kerns, San Jose, CA (US); Zhishi Peng, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 80 days.

(21) Appl. No.: 11/301,487

(22) Filed: Dec. 12, 2005

(65) Prior Publication Data

US 2007/0133245 A1 Jun. 14, 2007

(51) Int. Cl.
*G11C 5/06* (2006.01)
(52) U.S. Cl. .......................... 365/63; 365/201; 714/718
(58) Field of Classification Search ................ 365/63, 365/201; 366/201; 714/718; 716/4
See application file for complete search history.

(56) References Cited

U.S. PATENT DOCUMENTS

| | | | |
|---|---|---|---|
| 6,577,992 B1 | 6/2003 | Tcherniaev et al. | |
| 6,611,934 B2 * | 8/2003 | Whetsel, Jr. | ................ 714/727 |
| 6,982,903 B2 * | 1/2006 | Bertin et al. | ................ 365/163 |
| 7,151,695 B2 * | 12/2006 | Choy et al. | ............ 365/185.25 |

* cited by examiner

Primary Examiner—Son Dinh
Assistant Examiner—Nam Nguyen
(74) Attorney, Agent, or Firm—Bever, Hoffman & Harms, LLP; Jeanette S. Harms (57) ABSTRACT

A memory array can be optimized for SPICE simulation by modeling the memory array as a collection of boundary elements that track the cell states of memory cells connected to a particular array terminal. By maintaining a cell state distribution for each boundary element, the simulation behavior at the array terminal associated with that boundary element can be accurately determined by modeling each unique cell state, multiplying the results by the corresponding quantities from the cell state distribution, and then adding the results to obtain final values for the array terminal. This allows accurate simulation results to be achieved without needing to simulate each cell independently. Furthermore, by removing any references to unoccupied cell states (e.g., by removing such states from the cell state distribution and/or eliminating model equations for such states), the memory and cpu usage requirements during the simulation can be minimized.

21 Claims, 10 Drawing Sheets

SPICE OPTIMIZED FOR ARRAYS

BACKGROUND OF THE INVENTION

1. Field of the Invention

The invention is related to the field of circuit simulations, and in particular, to a technique for efficiently and accurately simulating memory arrays in SPICE.

2. Related Art

SPICE (Simulation Program with Integrated Circuits Emphasis) is a simulator for electronic circuits. The use of SPICE simulation beneficially allows circuits to be tested and analyzed without actually requiring that such circuits be physically constructed.

Figure 1:
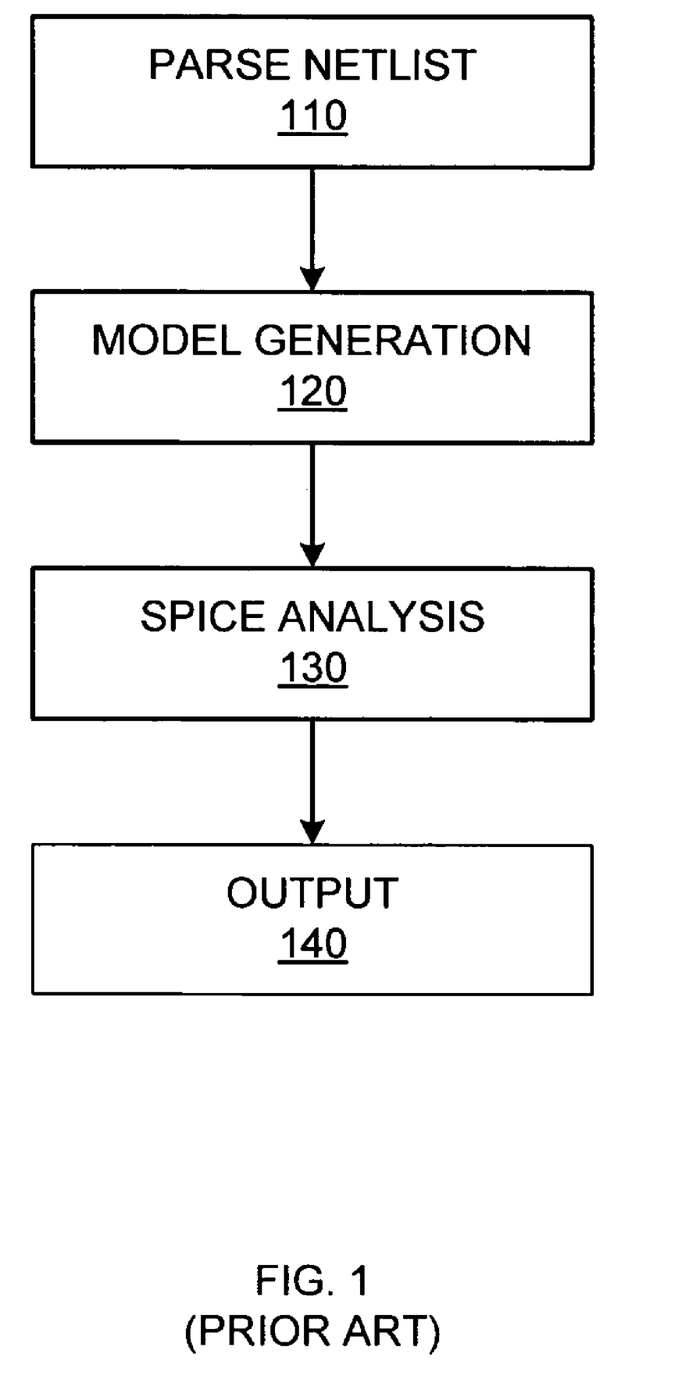
FIG. 1 is a flow diagram of a conventional SPICE simulation process.

FIG. 1 depicts a conventional methodology for analyzing a circuit using SPICE simulation. An electronic circuit is typically defined initially as a "netlist", which is simply a listing of devices and the connections between those devices. Typically the "devices" will be individual electronic components, such as transistors, resistors, and capacitors. However, depending on how the circuit is defined, the devices in a netlist may be basic functional blocks, such as AND gates and OR gates.

In any case, to begin a SPICE simulation, a netlist is separated into its component elements and interconnects in a "PARSE NETLIST" step 110. Mathematical models for those component elements are then specified in a "MODEL GENERATION" step 120. Specifically, the elements and interconnects extracted from the netlist in step 110 are defined as black box elements and interconnections between terminals of those black box elements. The internal behavior of each black box element is specified by a set of model equations that simulate the internal behavior of the device the black box element represents. The set of model equations generate voltage and/or current values for certain terminals of the black box element based on voltage and/or current values (and optionally historical voltage and/or current values) at other terminals of the black box element. Therefore, the set of model equations for a given black box element can be considered to be functions of state variables that represent the voltage, current (and optionally the historical voltage/current) values at the terminals of that black box element.

The combined model equations for the entire circuit are then solved in a "SPICE ANALYSIS" step 130. Specifically, a SPICE engine (i.e., an equation solver based on the SPICE algorithms) determines a set of voltages for the model element terminals that satisfies all the model equations and provides a net zero total current within the circuit (i.e., a set of voltages that results in Kirchoff's Laws being satisfied for the circuit). This equation solving operation is performed over a series of time steps across a range of inputs (sometimes referred to as the "input vector" for the simulation), thereby generating voltage/current results over time that are presented as the behavior of the circuit in an "OUTPUT" step 140.

In this manner, SPICE simulation provides a means for accurately determining the behavior of a circuit design. However, increases in circuit complexity and/or vector length can result in superlinear increases in computing time and memory usage for a SPICE engine. Specifically, because the circuit is "flattened" in step 120 (i.e., model elements (equations) are generated for every element defined in the original netlist), increases in circuit size and/or vector length will require a disproportionately larger increase in computing time and/or memory requirements.

Therefore, modern circuits are often analyzed using SPICE simulation techniques that are sometimes referred to as "fast-SPICE", in which intelligent approximations are used to reduce the computational load on the SPICE engine. Some conventional fast-SPICE techniques include dividing a large circuit into smaller sub-circuits (i.e., static or dynamic "partitioning"), or performing pre-analysis of the circuit design to determine which portions of the circuit will actually be operational so that analysis can be performed on only those portions of the circuit (i.e., "array reduction" or pattern detection).

Unfortunately, conventional fast-SPICE techniques are unable to effectively deal with large memory arrays when a large percentage of the cells are accessed. These large arrays are typically present in most modern IC designs. For example, a memory array structure precludes the efficient use of partitioning techniques, because the interconnected repetitive construction of the array precludes division into substantially independent sub-groupings. Likewise, array reduction techniques may provide some reduction in memory usage and runtime for relatively short input vectors by limiting analysis to a few cells in a memory array that are accessed over the course of the simulation. However, for the longer input vectors required to fully test modern circuits, the benefits of array reduction are quickly eliminated.

Accordingly, it is desirable to provide an efficient and accurate system and method for performing SPICE simulations on memory arrays.

SUMMARY OF THE INVENTION

Conventional SPICE modeling and simulation techniques are unable to efficiently and accurately simulate memory arrays. To overcome the limitations of conventional techniques, a memory array can be modeled as a set of black box elements (one for each array boundary terminal) that replaces the interior memory cells with boundary elements (mathematical models) that track the cell states of the memory cells connected to a particular array terminal. Each boundary element maintains a cell state distribution for those memory cells that allows the boundary element to simulate the behavior of those memory cells by modeling each unique cell state once, multiplying those results by the quantities from the cell state distribution, and then adding those results. In this manner, the overall behavior of the memory array can be simulated without modeling each individual cell within the memory array, thereby minimizing computing time and memory requirements.

In one embodiment, a method for analyzing a circuit can involve generating a SPICE model for the circuit by defining a boundary element at each terminal of a memory array in the circuit, and defining a tallying equation set in each boundary element that tracks the cell state distribution for the memory cells connected to the array terminal associated with that boundary element. Then, during SPICE simulation, the boundary elements can be processed to model the behavior at each array terminal by providing an updated cell state distribution for the boundary element, solving the model equations (e.g., using a SPICE engine) for the cell states, multiplying those results by the cell state distribution, and then adding those results to determine values for the state variables at the array terminal (e.g., voltage and/or current values). In one embodiment, model equations can be generated for only those cell states that exhibit a non-zero quantity in the cell state distribution. In another embodiment, the cell state model equations are retained between simulation time steps, the model equations for cell states that are no longer exhibited in the present time step by any of the memory cells connected to the array terminal can be eliminated.

In another embodiment, a software tool can include instructions for modeling a memory array by defining state variables for each terminal of the memory array, instructions for generating a boundary element for each terminal of the memory array, and instructions for tracking within each boundary element a cell state distribution for the memory cells connected to the memory array terminal associated with the boundary element. The software tool can further include instructions for solving a set of model equations for cell states in the cell state distributions of each boundary element, and then using those results to generate state variable values at the memory array terminals. In one embodiment, the software tool can include instructions for eliminating unpopulated cell states from the cell state distribution, thereby minimizing the quantity of model equations to be solved during the simulation. In another embodiment, existing model equations for a boundary element can be eliminated when none of the memory cells being tracked by that boundary element exhibit the cell state associated with those model equations.

In this manner, a SPICE simulation can be performed by modeling a memory array based on a cell state distribution for the memory cells connected to each memory array terminal of the memory array, without modeling each of those memory cells. Because the cell state distribution for a given memory array terminal captures the behavior of all the memory cells connected to that particular memory array terminal, an accurate simulation output can be generated from that cell state distribution. In addition, because all the memory cells connected to the memory array terminal are not individually modeled, runtime and memory usage during the simulation can be minimized. Furthermore, by removing cell states from the simulation that are no longer exhibited by any of the memory cells, even long input vectors will not significantly increase memory requirements for the simulation.

The invention will be more fully understood in view of the following description and drawings.

DETAILED DESCRIPTION

Conventional SPICE modeling and simulation techniques are unable to efficiently and accurately simulate memory arrays. To overcome the limitations of conventional techniques, a memory array can be modeled as a black box element that includes the terminals of the memory array, but replaces the interior memory cells with boundary elements (mathematical models) that track the cell states of the memory cells connected to a particular array terminal. Each boundary element maintains a cell state distribution for those memory cells that allows the boundary element to simulate the behavior of those memory cells by modeling each cell state once, multiplying those results by the quantities from the cell state distribution, and then adding those results. In this manner, the overall behavior of the memory array can be simulated without modeling each individual cell within the memory array, thereby minimizing computing time and memory requirements.

Figure 2A:
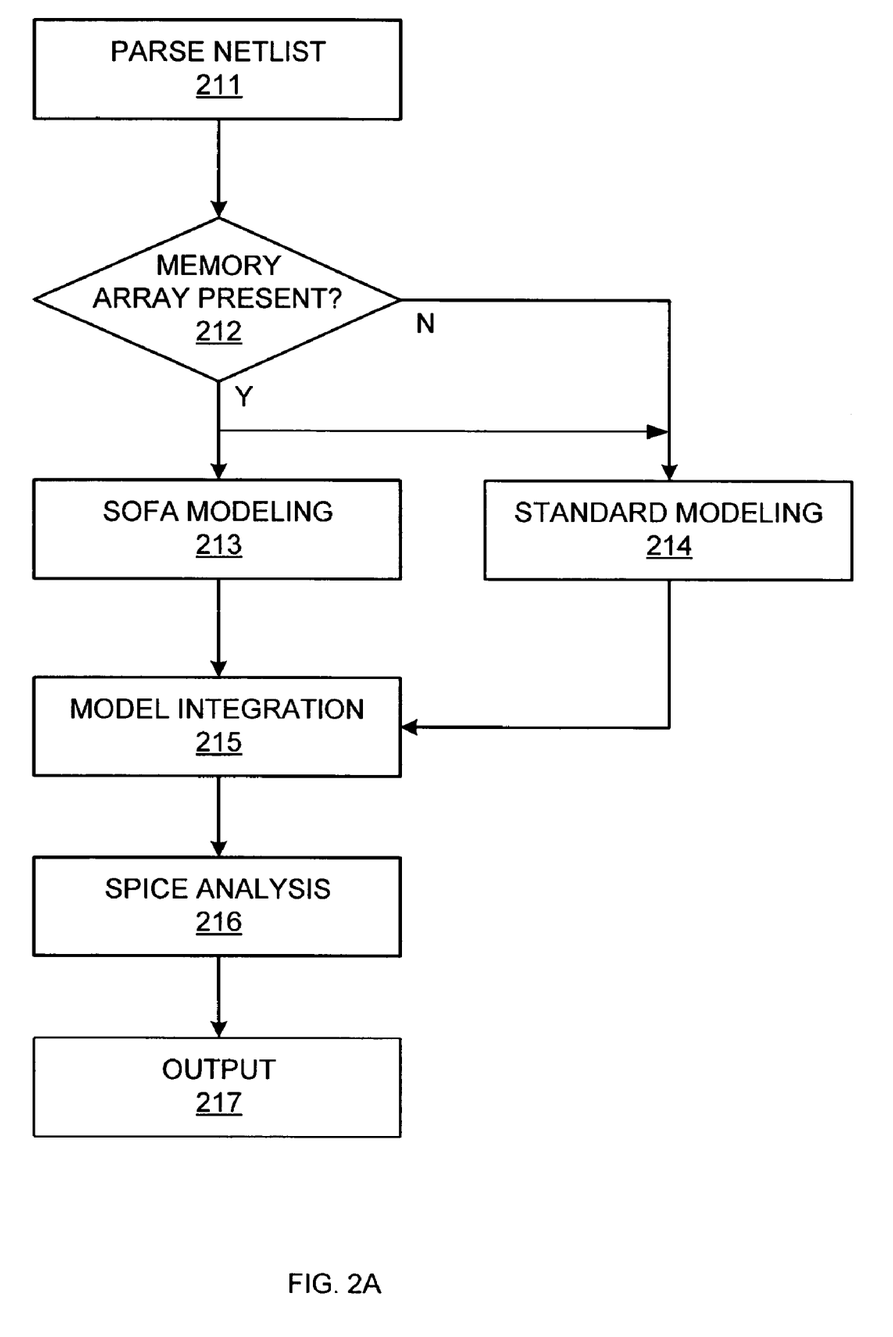
FIG. 2A is a flow diagram of a SPICE simulation process in which memory arrays are optimized for SPICE.

FIG. 2A shows a flow diagram of SPICE simulation process that incorporates memory array modeling, thereby allowing large memory arrays to be efficiently and accurately modeled by SPICE. For descriptive purposes, this modeling technique is referred to herein as "SPICE Optimized For Arrays" (SOFA). In an initial "PARSE NETLIST" step 211, the various components and interconnections defined by an input netlist are recognized. If a memory array(s) is identified in a "MEMORY ARRAY PRESENT?" step 212, that memory array(s) is modeled in a "SOFA MODELING" step 213.

Note that various manual or automated techniques may be used to identify memory arrays from netlist. For example, in one embodiment, potential memory cells can be initially identified, after which the organizational structure of those memory cells can be evaluated to determine whether they form a memory array. In another embodiment, memory arrays can be extracted directly from the hierarchy of a hierarchical netlist. Various other techniques will be readily apparent.

The SOFA modeling of a memory array in step 213 (described in greater detail below with respect to FIGS. 2B and 2C) involves the generation of a set of equations for the array that tracks the number of memory cells in different cell states (i.e., exhibiting different voltage, current, and optionally, historical voltage and/or current values) and then calculates simulation output values for the memory array based on the distribution of cell states (i.e., the number of memory cells in each cell state). As a result, a mathematical model for each individual memory cell need not be created, which in turn significantly reduces the runtime complexity and memory requirements for the memory array (and hence the IC incorporating the memory array).

Non-memory array portions of the circuit can be modeled (either subsequent to or concurrently with step 213) using conventional SPICE modeling techniques in a "STANDARD MODELING" step 214. The mathematical models generated in steps 213 and 214 can then be combined to form the final SPICE model for the circuit in a "MODEL INTEGRATION" step 215. That model can then be simulated using conventional SPICE techniques in a "SPICE ANALYSIS" step 216 to generate a simulation output for the circuit in an "OUTPUT" step 217. Note that from the perspective of the SPICE engine used in step 216, any SOFA models for memory arrays generated in step 213 are simply another black box element in the overall mathematical model. Therefore (and as described in greater detail below with respect to FIGS. 2D and 3A-3E), the SOFA modeling of step 213 can significantly reduce the time and memory requirements during the actual circuit simulation of step 216, without sacrificing simulation accuracy or requiring modifications to the SPICE algorithms.

As noted above, the method of generating a SOFA model involves the generation of a mathematical model for a memory array without defining mathematical models for each individual memory cell. To achieve this result, the SOFA modeling technique takes advantage of the highly regular array arrangement of memory arrays and the fact that most memory cells in a memory array are in either a stable logic HIGH or stable logic LOW state at any given time. Specifically, the SOFA modeling technique replaces the rows and columns of memory cells in a memory array with "boundary elements" that capture the behavior of the memory cells in those rows and columns based on a cell state-based approach, rather than on an individual memory cell modeling approach.

Figure 2B:
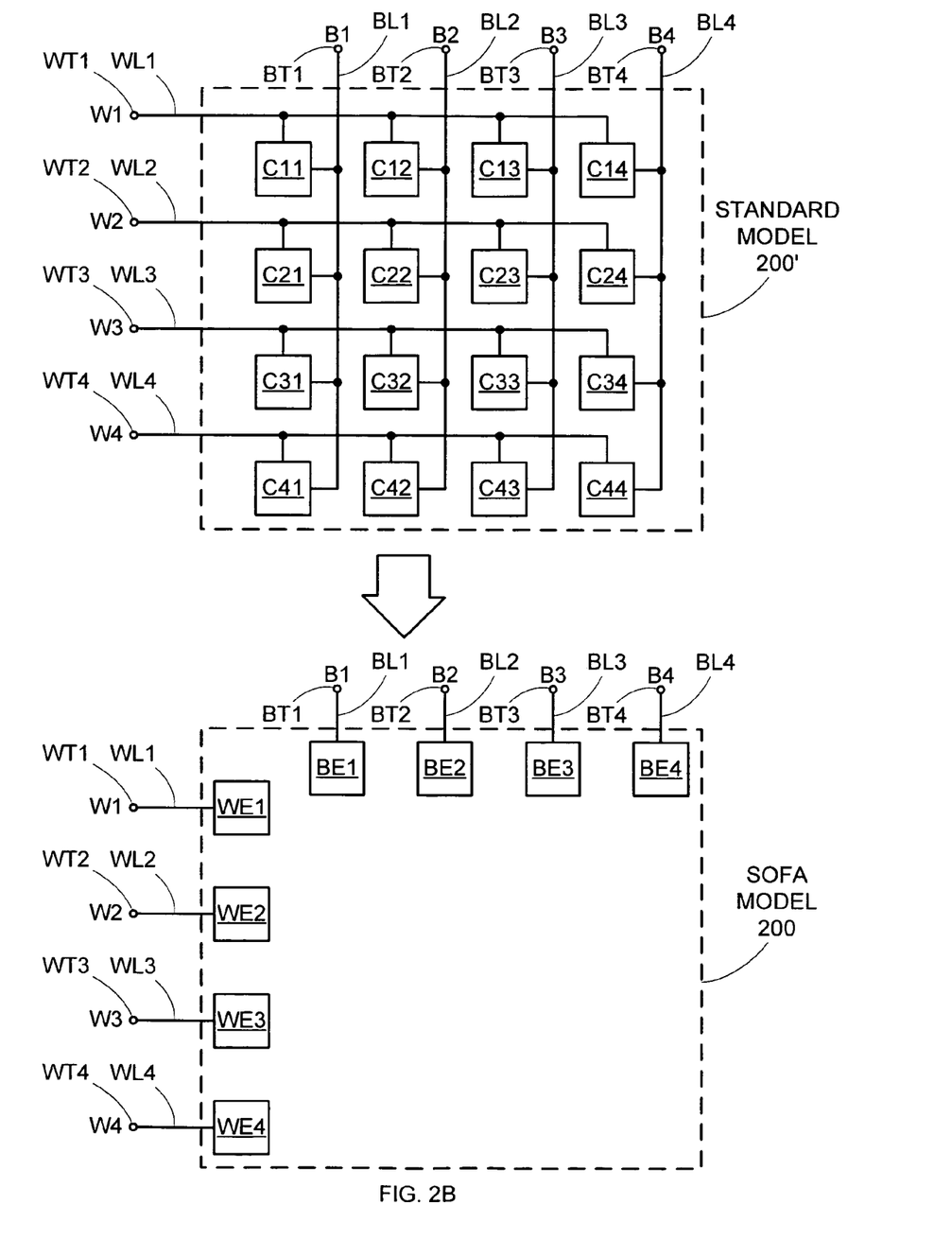
FIG. 2B is a graphical representation of memory array modeling optimization for SPICE.

For example, FIG. 2B provides a set of schematic diagrams that conceptually illustrate this SOFA modeling concept. A standard model 200' for an exemplary memory array includes a rectangular array of memory cells C11 through C44 arranged in a 4×4 array. Each row of memory cells is connected to one of word lines WL1 through WL4, while each column of memory cells is connected to one of bit lines BL1 through BL4. Note that while a small 4×4 array is depicted and described for exemplary purposes, the SOFA modeling techniques described herein can be applied to memory arrays of any dimension and any type (e.g., flash memory or content addressable memory (CAM)). In fact, the larger the dimensions of the memory array, the greater the benefit provided by the SOFA technique.

State variable sets W1 through W4 are assigned to word line terminals WT1 through WT4, respectively. Similarly, state variable sets B1 through B4 are assigned to bit lines terminals BT1 through BT4, respectively. Each of state variable sets W1-W4 and B1-B4 includes voltage and current (and optionally, historical voltage and current) variables for its respective bit line or word line. During SPICE simulation of standard model 200', the actual values for state variable sets W1-W4 and B1-B4 are either provided as inputs or generated via simulation of memory cells C11 through C44. It is this simulation of individual memory cells that leads to long runtimes and high memory usage during SPICE simulation.

SOFA modeling "converts" discrete memory cells C11 through C44 into boundary elements WE1 through WE4 and BE1 through BE4 in SOFA model 200. Boundary elements WE1 through WE4 are associated with array terminals WT1 through WT4, respectively, of word lines WL1 through WL4, respectively, and boundary elements BE1 through BE4 are associated with array terminals BT1 through BT4, respectively, of bit lines BL1 through BL4, respectively. Each of boundary elements WE1-WE4 and BE1-BE4 tracks the behavior of the memory cells (i.e., memory cells C11 through C44 in standard model 200') connected to the particular word line terminal or bit line terminal associated with that boundary element. Specifically, each boundary element WE1-WE4 and BE1-BE4 recognizes the different cell states exhibited by the memory cells connected to a particular word line or bit line terminal and maintains a count of the number of memory cells in each of those cell states.

Thus, for example, boundary element BE1 is associated with array terminal BT1. Therefore, boundary element BE1 tracks the behavior of memory cells C11, C21, C31, and C41, which are all connected to bit line terminal BT1 (bit line BL1). For example, if memory cells C11, C21, and C31 are all in logic HIGH states and memory cell C41 is in a logic LOW state, boundary element BE1 would track two cell states, with three memory cells in the first state (logic HIGH state) and one memory cell in the second state (logic LOW state).

Note that for simplicity, it is assumed that memory cells C11, C21, and C31 are all in stable logic HIGH states (i.e., have been storing logic HIGH values for as many time steps as are needed by the integration method (e.g. one step for Backward Euler and two steps for $2^{nd}$ order Gear), so that any historical voltage/current values at those cells are all the same). If memory cells C11, C21, and C31 have different historical voltage/current values (e.g., memory cell C21 just finished transitioning to a logic HIGH state, while memory cells C11 and C31 have been at logic HIGH states for at least three clock cycles), boundary element BE1 would simply include an additional cell state for memory cell C21.

In a similar manner, boundary element BE2 tracks the cell states for memory cells C12, C22, C32, and C42, all of which are connected to bit line BL2, boundary element BE3 tracks the cell states for memory cells C13, C23, C33, and C43, all of which are connected to bit line BL3, and boundary element BE4 tracks the cell states for memory cells C14, C24, C34, and C44, all of which are connected to bit line BL4. Likewise, boundary element WE1 tracks the cell states for memory cells C11, C12, C13, and C14, all of which are connected to word line WL1, boundary element WE2 tracks the cell states for memory cells C21, C22, C23, and C24, all of which are connected to word line WL2, boundary element WE3 tracks the cell states for memory cells C31, C32, C33, and C34, all of which are connected to word line WL3, and boundary element WE4 tracks the cell states for memory cells C41, C42, C43, and C44, all of which are connected to word line WL4.

Note that because each boundary element of SOFA model 200 tracks all the memory cells connected to a particular word line or bit line, the same memory cell may be tracked by multiple boundary elements. For example, because memory cell C11 is connected to both word line WL1 and bit line BL1, memory cell C11 is tracked by both boundary elements WE1 and BE1, respectively. However, as described in greater detail below, because a mathematical model is not generated for each individual cell tracked by a boundary element, this "overlapping" memory cell tracking by multiple boundary elements does not significantly increase simulation runtime or memory requirements.

Note further that for exemplary purposes, the memory array depicted as standard model 200' only includes word lines and bit lines (WL1-WL4 and BL1-BL4), and therefore SOFA model 200 only includes boundary elements associated with the word line and bit line array terminals (WT1-WT4 and BT1-BT4). However, other memory arrays may include additional or alternative array terminals. In each case, boundary elements would then be defined to track the memory cells connected to each of those additional or alternative array terminals. For example, certain memory arrays may include power lines for each row or each column of the array. Boundary elements could then be defined for each of those power lines, with each of those boundary elements tracking the memory cells connected to one of the power lines.

Figure 2C:
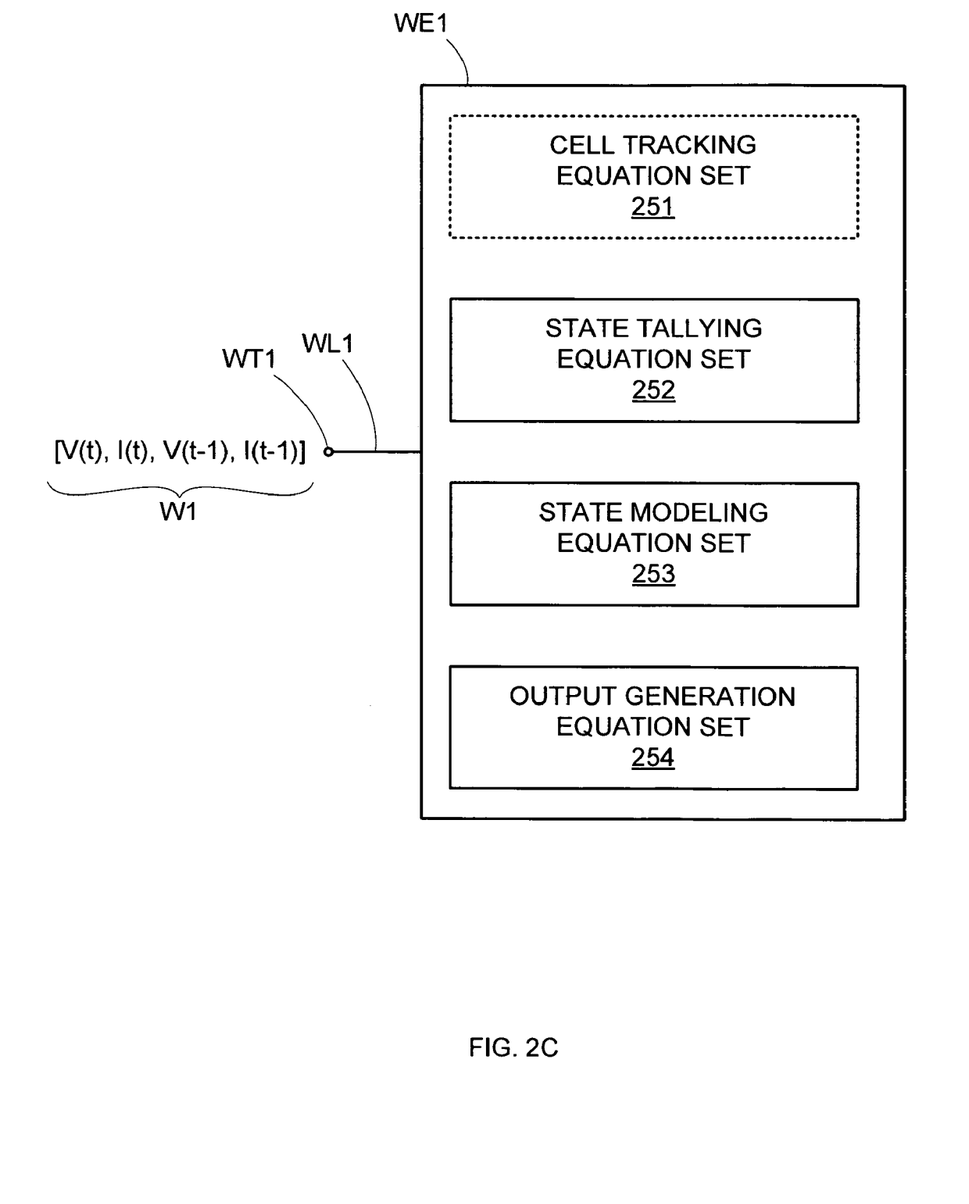
FIG. 2C is a schematic diagram of an exemplary boundary element for use in a SPICE-optimized memory array model.

FIG. 2C shows an exemplary diagram of the implementation of boundary element WE1 from SOFA model 200 in FIG. 2B. Note that boundary elements WE2-WE4 and BE1-BE4 will include similar elements. As noted above, boundary element WE1 is associated with word line array terminal WT1 (and hence, word line WL1), and therefore includes equations that are functions of state variable set W1 (i.e., one or more state variables assigned to array terminal WT1). For exemplary purposes, state variable set W1 is depicted as including the variables present voltage V(t) (i.e., the voltage at terminal WT1 during the current time step t), present current I(t) (i.e., the current at terminal WT1 during the present time step t), historical voltage V(t-1) (i.e., the voltage at terminal WT1 during the previous time step t-1), and historical current I(t-1) (i.e., the current at terminal WT1 during the previous time step t-1). Note, however, that in various other embodiments, state variable set W1 could include any number of historical voltage and/or current variables (e.g., V(t-2) and I(t-2)).

To provide the mathematical framework for subsequent SPICE simulation of SOFA model 200, and in particular, the mathematical framework for the determination of the voltage/current behavior at terminal WT1, boundary element WE1 includes an optional cell tracking equation set 251 (indicated by the dotted outline), a state tallying equation set 252, a state modeling equation set 253, and an output generation equation set 254. These equation sets work together during a SPICE simulation to provide an accurate simulation of the behavior of the memory cells connected to word line WL1 (i.e., memory cells C11, C12, C13, and C14, as shown in FIG. 2B).

Cell tracking equation set 251 (note that an "equation set" includes one or more equations) tracks the states of the various memory cells connected to word line WL1/terminal WT1. Specifically, cell tracking equation set 251 monitors the cell state of each of memory cells C11, C12, C13, and C14, and provides this cell state information to state tallying equation set 252, which then compiles a count of the number of memory cells in each particular cell state. Note that cell state changes for memory cells connected to a particular terminal may occur due not only to voltage and/or current changes at that terminal, but also due to voltage and/or current changes at a different terminal. For example, the state of memory cell C11 is affected by both the voltage on word line terminal WT1 and the voltage on bit line terminal BT1. Therefore, cell tracking equation set 251 must either monitor all the array terminals connected to the memory cells being tracked in boundary element WE1, or must be otherwise informed of changes at any terminals connected to those memory cells. Note further that although cell tracking equation set 251 is indicated as being included in boundary element WE1 for exemplary purposes, in various other embodiments, SOFA model 200 (shown in FIG. 2B) can include a separate cell tracking equation set (i.e., discrete from individual boundary elements) that simply provides the appropriate cell state information to each boundary element.

Once state tallying equation set 252 has compiled updated counts for the different cell states for those memory cells being tracked by boundary element WE1, state modeling equation set 253 generates model equations for those different cell states. To minimize memory usage during SPICE simulation of SOFA model 200, state modeling equation set 253 can generate the model equations for only those cell states exhibited by a non-zero quantity of memory cells. For example, the memory cells being tracked by boundary element WE1 could all be in a first state, except for a single memory cell in a second state. If that memory cell transitions from the second state to the first state, and no other memory cell transitions into a different cell state, state modeling equation set 253 could generate the model equations for just the first state (i.e., a set of model equations for a memory cell in the first state). Note, however, that in various other equations, state modeling equation set 253 can include model equations for a variety of cell states, even if one or more of those memory states are not populated by any of the memory cells being tracked by boundary element WE1. However, due to the large number of possible cell states, this latter approach can be significantly less memory-efficient than generating model equations for only those cell states exhibiting a non-zero quantity in the cell state distribution.

In either case, once the model equations have been defined by state modeling equation set 253, output generation equation set 254 can use those model equations in conjunction with the cell state count values generated by state tallying equation set 252 to provide value(s) for state variable set W1. Specifically, output generation equation set 254 can solve the model equations for each cell state (typically by providing these model equations to the SPICE engine), multiply those results by the corresponding cell state count values, and then add the resulting products to define values for the voltage (e.g., V(t)) and current (e.g., I(t)) state variables. Note that the results of the model equations may include any combination of voltage and current values for each of the cell states. Therefore, output generation equation set 254 can provide values for any combination of voltage and current state variables for array terminal WT1.

Because model equations are only solved for cell states, rather than for each memory cell being tracked by boundary element WE1, the behavior of SOFA model 200 at terminal WT1 can be efficiently determined. At the same time, because the behavior of each memory cell being tracked by boundary element WE1 is being accounted for, the results provided by output generation equation set 254 are still an accurate indication of actual circuit behavior. Because the same state-based modeling principles are applied to all boundary elements in SOFA model 200, SOFA model 200 can reduce the runtime and memory requirements during SPICE simulation by an order of magnitude or more over conventional full SPICE simulation. The technique can even provide significant improvements in runtime and memory usage over fast-SPICE simulation techniques, without suffering the loss of accuracy typically associated with those fast-SPICE techniques.

Figure 2D:
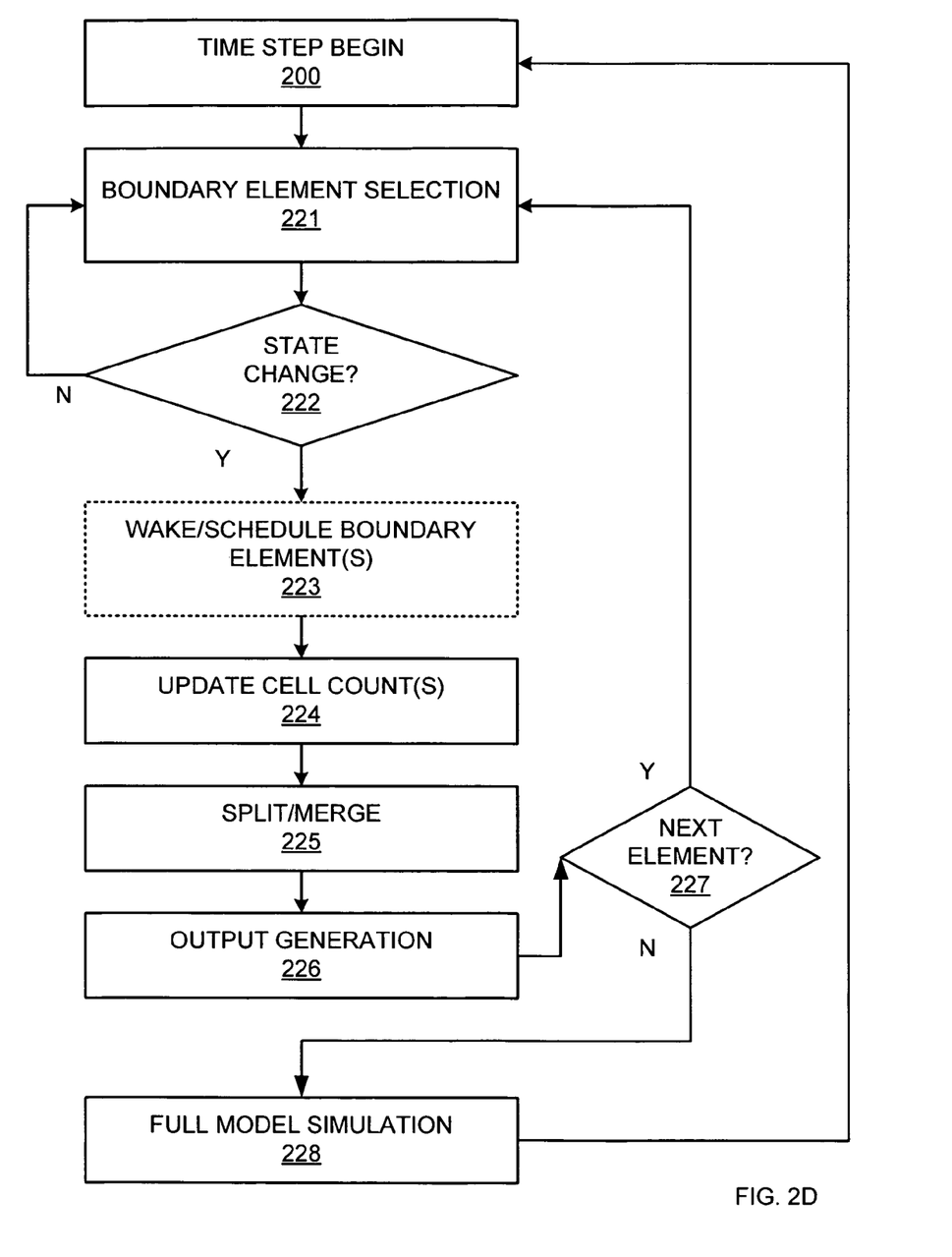
FIG. 2D is a detailed flow diagram of a SPICE simulation process for a boundary element in a SPICE-optimized memory array model.

FIG. 2D shows an exemplary flow diagram depicting the SPICE simulation operation for a SPICE model that includes SOFA model 200, as described above with respect to FIGS. 2B and 2C. The process begins with an initial simulation time step in a "TIME STEP BEGIN" step 200. One of boundary elements WE1-WE4 and BE1-BE4 is selected for which state values are to be determined for one or more state variables in a "BOUNDARY ELEMENT SELECTION" step 221. Note that in some embodiments, the selected boundary element must be a boundary element for which cell state changes are indicated (i.e., memory cell activity is likely) due to changes in state variable inputs at any array terminal connected to cells associated with that boundary element, pre-existing transitional states (i.e., cell states between stable logic HIGH or logic LOW cell states), and/or activity in other boundary elements that could affect memory cells within the selected boundary element. In various other embodiments, every boundary element can be evaluated during each time step of the SPICE simulation.

In any case, to begin the evaluation of the selected boundary element, the memory cells associated with that boundary element (e.g., memory cells C11, C12, C13, and C14 associated with boundary element WE1) are evaluated for state changes (e.g., by cell tracking equation set 251 in FIG. 2C) in a "BOUNDARY ELEMENT SELECTION" step 221. If no cell state changes are detected in a "STATE CHANGE?" step 222, the process simply loops back to step 221 for selection of the next boundary element, because if none of the memory cells have changed state, none of the state variables for the array terminal to which those memory cells are connected have changed.

However, if a cell state change is detected in step 222, any affected boundary elements can be notified (e.g., by cell tracking equation set 251 in FIG. 2C) in an optional "WAKE/SCHEDULE BOUNDARY ELEMENT(S)" step 223 (indicated by the dotted outline). Specifically, if the changes detected for memory cells associated with boundary element being evaluated can affect memory cells in other boundary elements, those elements are indicated ("wake up") for evaluation (as described above with respect to step 221) and/or are scheduled for shorter or longer time step evaluation (for higher resolution or lower resolution, respectively, in the simulation process). Note that in various other embodiments, step 223 can be bypassed and every boundary element can be evaluated during each time step of the SPICE simulation.

Next, based on the cell state changes detected in step 222, the distribution of cell states among the memory cells associated with the boundary element (i.e., the counts for the number of memory cells in each different cell state) is updated (e.g., by state tallying equation set 252 in FIG. 2C) in an "UPDATE CELL COUNT(S)" step 224. If cell state model equations are retained between time steps, in a "SPLIT/MERGE" step 225 any model equations required for new cell states are generated ("split"), and model equations for any unused cell states are removed ("merged"), thereby defining the model equation sets for the current time step (e.g., as performed by state modeling equation set 253 in FIG. 2C).

Note that in one embodiment, this split/merge operation can actually be performed during the cell state count updating of step 224. Specifically, the generation of an updated cell state distribution in step 224 can involve the adding of new cell states and the removal of unoccupied cell states from the cell state distribution. Subsequent model equation generation for the cell states listed in the cell state distribution would then automatically create ("split") model equation sets for the new cell states and eliminate ("merge") model equation sets for the unused cell states.

In any case, once the model equation sets for the existing cell states are defined, those model equation sets can then be solved, the results can be multiplied by the corresponding cell state count values from step 224, and the products of those multiplications can be summed up (added together) to provide output values for the state variables at the array terminal associated with the boundary element in an "OUTPUT GENERATION" step 226 (e.g., as described with respect to output generation equation set 254 in FIG. 2C). If the state values are to be determined for one or more state variables for another boundary element, as determined in "NEXT ELEMENT?" step 227, then the process returns to step 221 to begin evaluation of the next boundary element.

Once all desired boundary elements have been evaluated, the process moves on to complete the simulation of the entire SPICE model in a "FULL MODEL SIMULATION" step 228. Note that although step 228 is depicted as following steps 221-227 for exemplary purposes, in various other embodiments the non-SOFA portions of a SPICE model can be evaluated before or concurrently with the SOFA portions. In either case, once the entire SPICE model has been simulated for a given simulation time step, the process loops back to step 200 and evaluation at the next simulation time step begins. In this manner, the cell state-based modeling technique for memory arrays described with respect to steps 221-227 allows an efficient and accurate SPICE simulation to be run on an IC design.

FIGS. 3A through 3E provide an exemplary graphical depiction of the modeling technique described above with respect to FIGS. 2B-2D. FIGS. 3A through 3E depict the simulation behavior of SOFA model 200 (as described with respect to FIG. 2B) during successive time steps of a SPICE simulation. This SPICE simulation is typically implemented by software (instructions) running on a computer system (indicated by the arrow directed from computer system 300) based on logic (e.g., software code) that executes the modeling and SPICE algorithms.

For explanatory purposes, in each of FIGS. 3A through 3E, the cell state count values for boundary elements WE2 and BE2 are displayed, along with graphical indications (various shadings) of the various cell states for memory cells C11 through C44. As described above, memory cells C11 through C44 are not individually modeled within boundary elements WE1-WE4 and BE1-BE4, and are therefore depicted only for reference purposes (as indicated by the dotted lines).

Figure 3A:
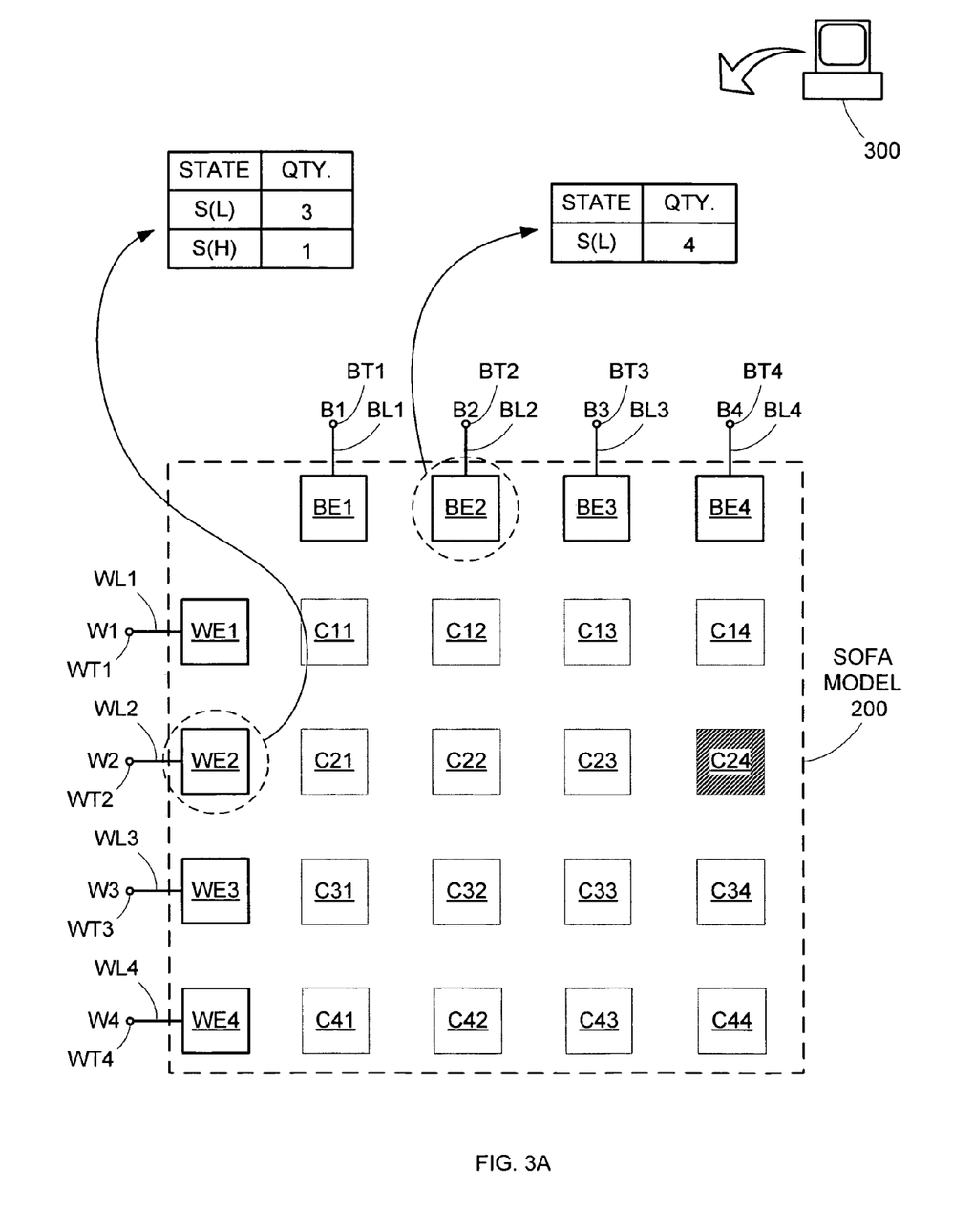
FIGS. 3A-3E depict a graphical representation of a SPICE simulation procedure on a SPICE-optimized memory array model.

In FIG. 3A, all memory cells are in a logic LOW state (state S(L)) except for memory cell C24, which is in a logic HIGH state (state S(H)). Boundary element WE2 tracks the memory cells connected to (word line) terminal WT2 (i.e., memory cells C21, C22, C23, and C24). Therefore, boundary element WE2 includes a cell state count (e.g., provided by state tallying equation set 252 described with respect to FIG. 2C) that specifies a quantity of three memory cells in logic LOW cell state S(L), and a quantity of one memory cell in logic HIGH cell state S(H). Similarly, boundary element BE2 tracks the memory cells connected (bit line) terminal BT2 (i.e., memory cells C12, C22, C32, and C42), and therefore includes a cell state count that specifies a quantity of four memory cells in logic LOW cell state S(L).

As described above with respect to 2A-2D, these cell state count values can be used to determine simulation values for state variable sets W2 (at terminal WT2) and B2 (at terminal BT2) can be determined (e.g., using state modeling equation set 253 and output generation equation set 254 as described with respect to FIGS. 2C and 2D). For example, value(s) for state variable set W2 could be determined by solving the logic LOW cell state model equations and the logic HIGH cell state model equations, multiplying those results by three and one, respectively, and then adding those products (i.e., W2=3*S(L)+S(H)). Likewise, value(s) for state variable set B2 could be determined by solving the logic LOW cell state model equations and multiplying those results by four (i.e., B2=4*S(L)). The state variable values for the other terminals of SOFA model 200 can be determined in a similar fashion.

Figure 3B:
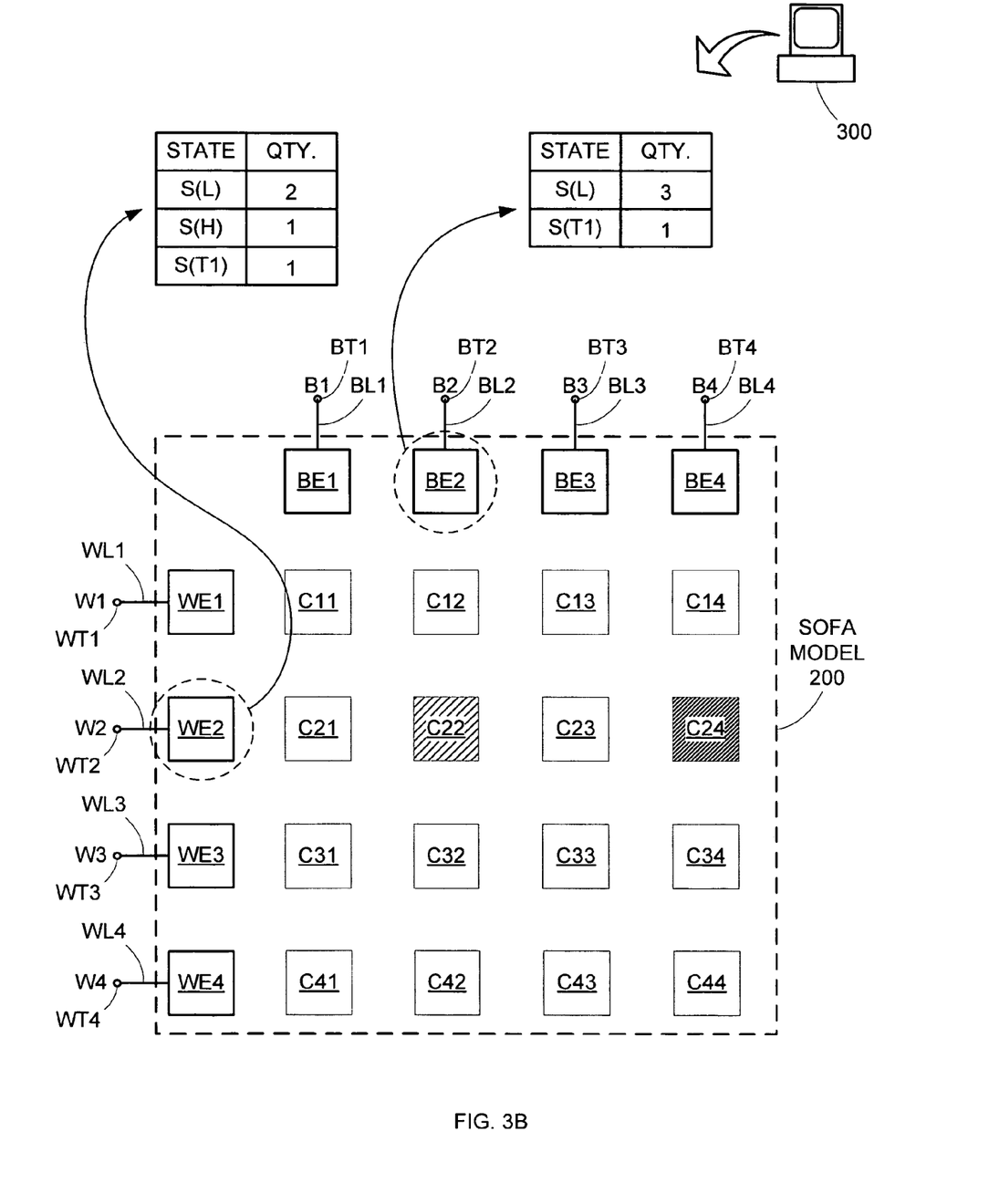

During the next SPICE simulation time step, shown in FIG. 3B, memory cell C22 begins transitioning from a logic LOW state to a logic HIGH state, and is therefore in a first transitional (intermediate) cell state (state S(T1)) during the simulation. Therefore, the cell state count for boundary element WE2 is updated to specify a quantity of two cells in logic LOW cell state S(L), one cell in logic HIGH cell state S(H), and one cell in transitional cell state S(T1). Because memory cell C22 is also tracked by boundary element BE2, the cell state count for boundary element BE2 is also updated, and now specifies a quantity of three cells in logic LOW cell state S(L) and one cell in transitional cell state S(T1). Because a transitional cell state S(T1) is a new state (i.e., not present during the previous simulation time step), a new set of cell state model equations must be split off from the existing set of cell state model equations.

Updated values for state variable sets W2 and B2 can then be calculated using the same technique of solving each set of cell state model equations, multiplying the results by the quantity of memory cells in those cell states, and adding those results. Thus, the value(s) for state variable set W2 can be determined by adding twice the results of the model equations for logic LOW cell state S(L), the results of the model equations for logic HIGH cell state S(H), and the results of the model equations for transitional cell state S(T1) (i.e., W2=2*S(L)+S(H)+S(T1)). Similarly, the value (s) for state variable set B2 can be determined by adding three times the results of the model equations for logic LOW state S(L) to the results of the model equations for transitional state S(T1) (i.e., B2=3*S(L)+S(T1)).

Figure 3C:
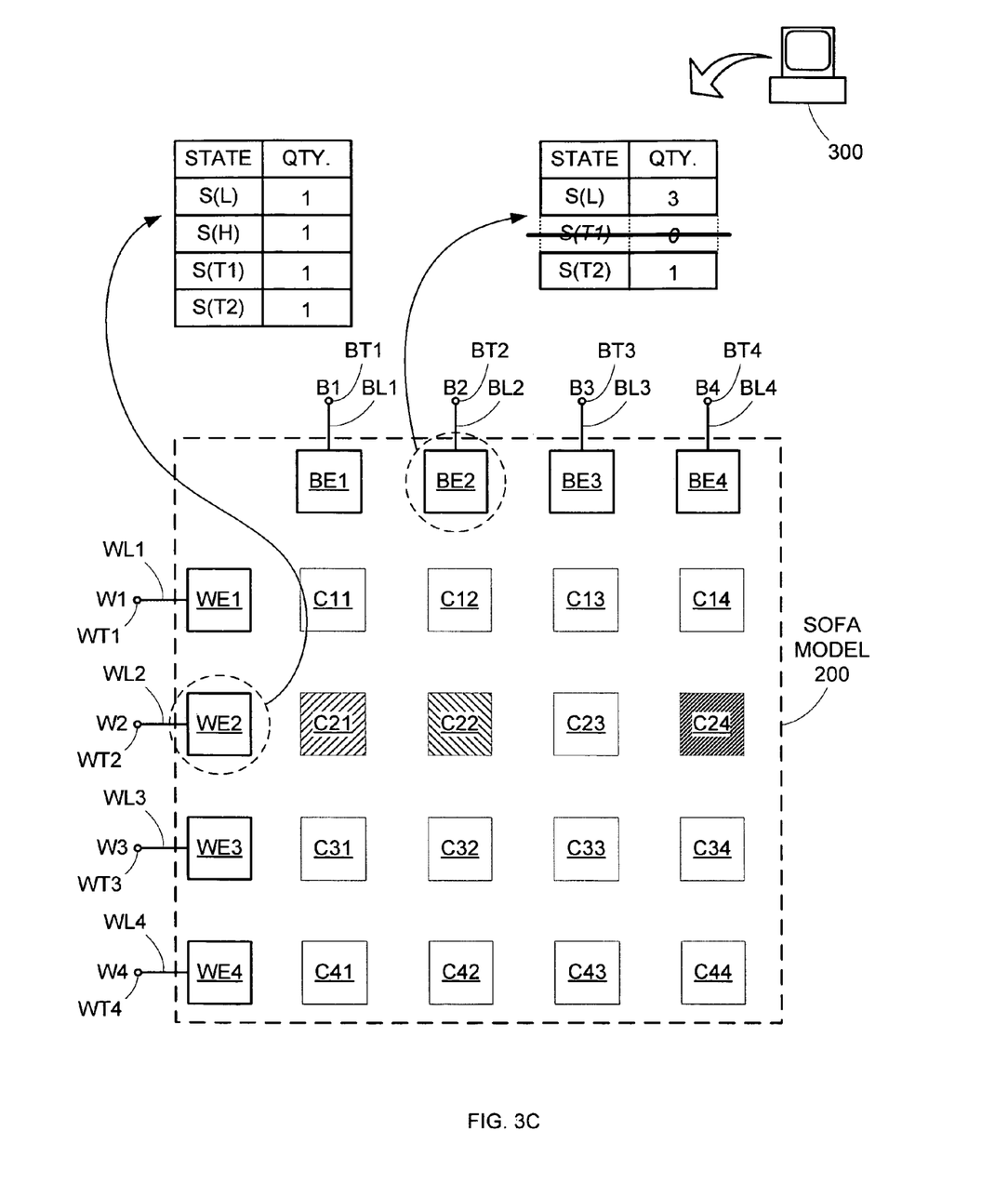

During the next SPICE simulation time step shown in FIG. 3C, memory cell C22 continues transitioning from logic LOW to logic HIGH, and enters a second transitional state S(T2), while memory cell C21 begins transitioning from logic LOW to logic HIGH and enters transitional state S(T1). Note that for exemplary purposes, memory cell C21 is depicted as entering the same transitional state S(T1) that memory cell C22 occupied in the previous simulation time step (i.e., in FIG. 3B). However, an infinite variety of transitional states can exist for memory cells transitioning between logic LOW and logic HIGH states (due, for example, to variations in timing and/or values of input parameters).

In light of the new cell state changes to memory cells C21 and C22, the cell state counts for boundary elements WE2 and BE2 are updated again to reflect the new cell state distributions. The cell state count for boundary element WE2 now specifies a single cell in each of cell states S(L), S(H), S(T1), and S(T2), and the cell state count for boundary element BE2 now specifies three memory cells in logic LOW cell state S(L) and a single memory cell in transitional state S(T2). The value(s) for state variable set W2 can then be determined by adding the results of the model equations for each of states S(L), S(H), S(T1), and S(T2), while the value(s) for state variable set B2 can be determined by adding three times the results of the model equations for logic LOW cell state S(L) to the results of the model equations for transitional state S(T2).

Note that because none of the memory cells tracked by boundary element BE2 occupy transitional state S(T1), that state is removed from the listing of cell states (indicated by the strikethrough), thereby freeing any resources that had previously been used to specify that cell state. This merging technique eliminates resource expenditures on unused cell states, thereby minimizing memory usage during SPICE simulation of SOFA model 200.

Figure 3D:
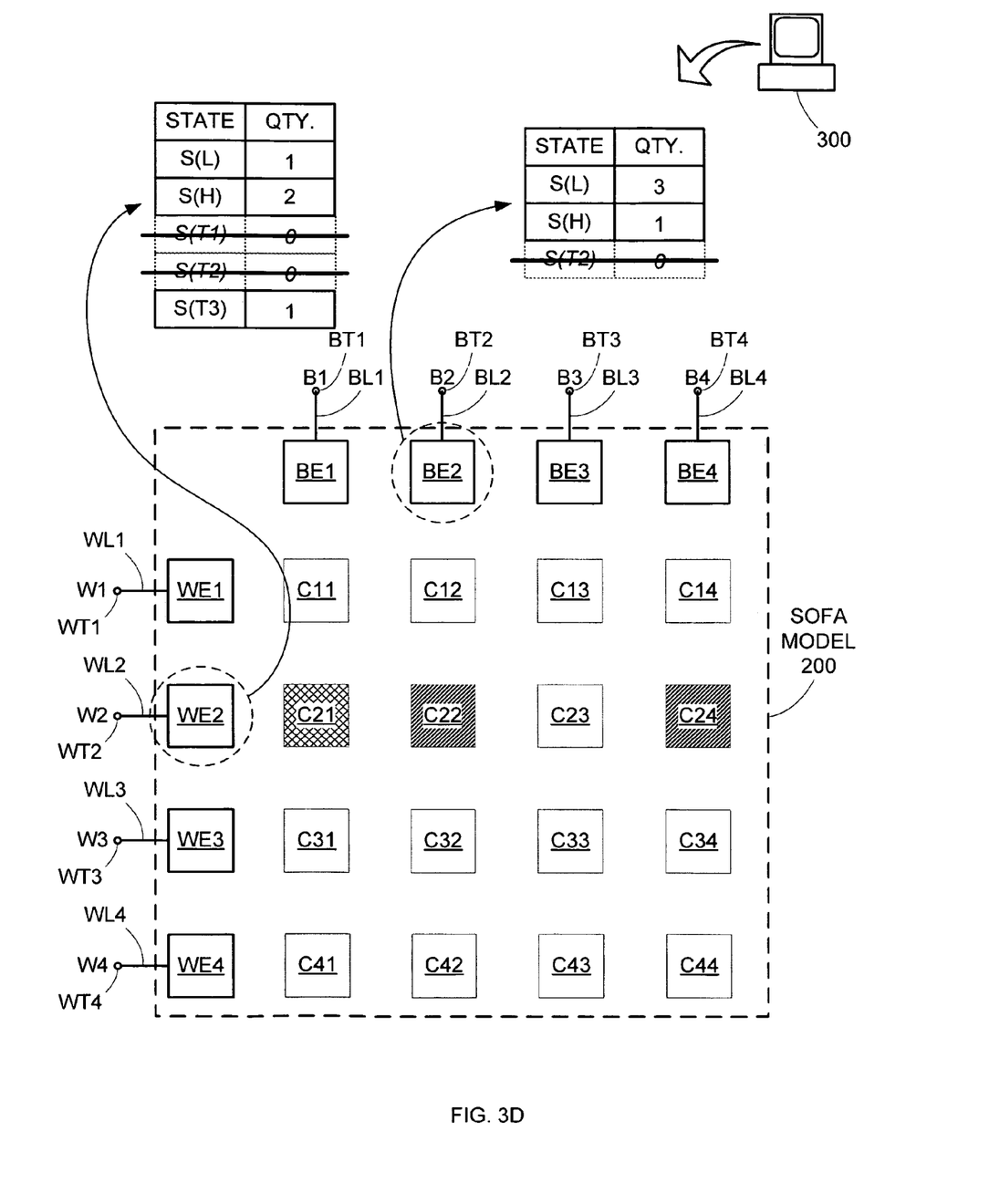

During the next SPICE simulation time step shown in FIG. 3D, memory cell C22 completes its transition to logic HIGH state S(H), while memory cell C21 reaches a third transitional state S(T3). (Note that any number of transitional states can be defined for all or specific sets of memory cells in an array. In this example, memory cell C22 can be one cell defined as having 3 transitional states.) Accordingly, in boundary element WE2, transitional cell state S(T3) is defined (split) and unused transitional cell states S(T1) and S(T2) are eliminated (merged), and in boundary element BE2, transitional cell state S(T2) is eliminated. The updated cell state count for boundary element WE2 specifies one, two, and one memory cell in states S(L), S(H), and S(T3), respectively, and the updated cell state count for boundary element BE2 specifies three and one memory cells in states S(L) and S(H), respectively.

Note that for simplicity, cell history is not being tracked by the boundary elements of SOFA model 200. Tracking cell history (i.e., differentiating cell states by historical voltage/ current values, in addition to present voltage/current values) would simply involve additional cell states. For example, if the definition of a cell state includes the cell voltage during the previous time step, memory cell C22 would not be merged into the logic HIGH cell state S(H) of memory cell C24 until the time step following the present time step.

Just as described with respect to FIGS. 3A-3C, once the cell state counts for boundary elements WE2 and BE2 are defined, the value(s) for state variable sets W2 and BE2 can be determined. Thus, the value(s) for state variable set W2 can be calculated by adding the results of the model equations for logic LOW cell state S(L), twice the results of the model equations for logic HIGH cell state S(H), and the results of the model equations for transitional state S(T3). Likewise, the value(s) for state variable set B2 can be calculated by adding three times the results of the model equations for logic LOW cell state S(L) to the results of the model equations for logic HIGH cell state S(H).

Figure 3E:
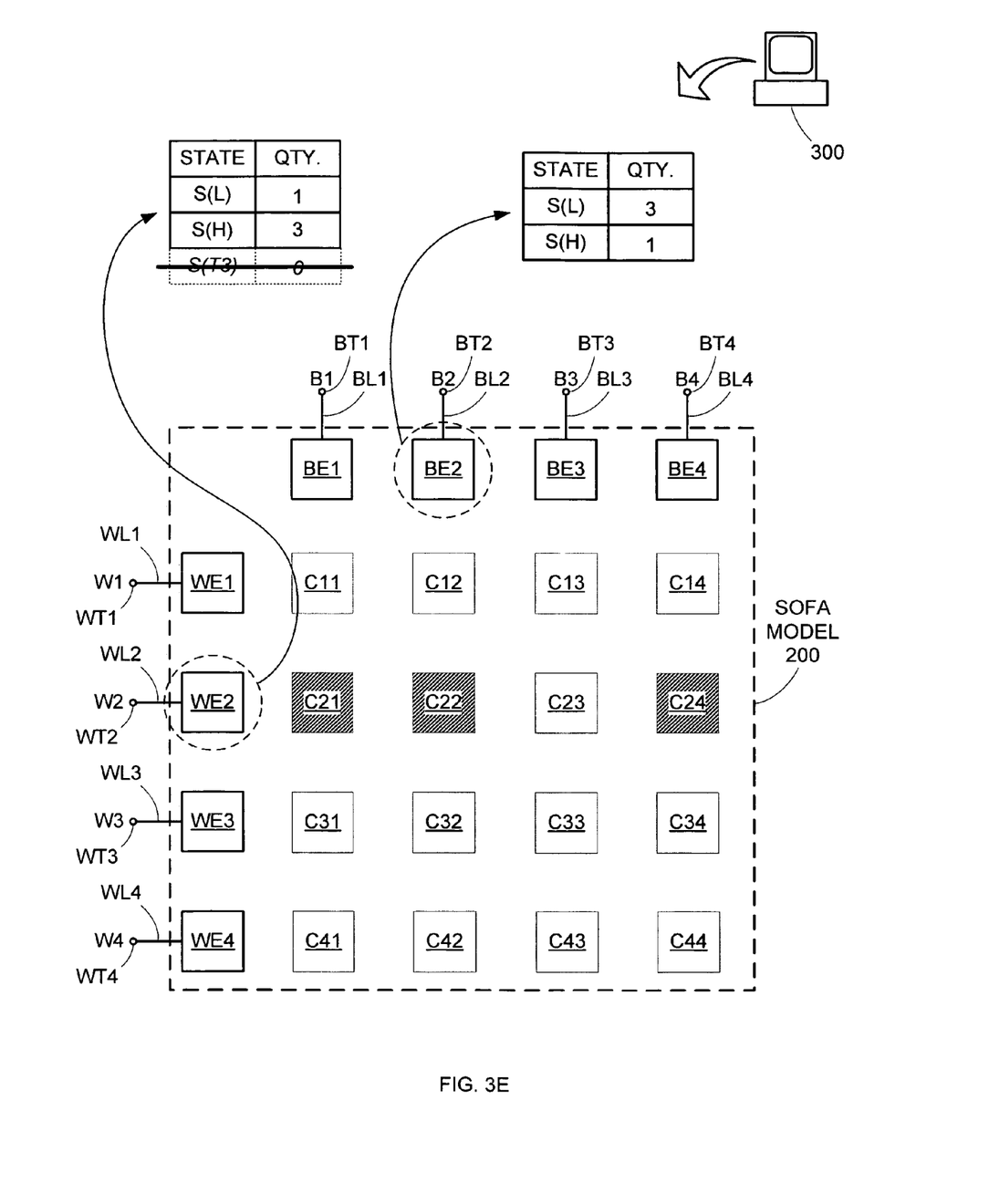

Finally, in the next SPICE simulation time step shown in FIG. 3E, memory cell C21 completes its transition to logic HIGH state S(H), thereby causing boundary element WE2 to eliminate unused cell state S(T3), and allowing the value(s) for state variable set W2 to be calculated by adding the results of the model equations for logic LOW cell state S(L) to three times the results of the model equations for logic HIGH cell state S(H). Note that because no cell state changes have occurred in the memory cells being tracked by boundary element BE2, the value(s) for state variable set B2 need not be recalculated during this simulation time step. Therefore, in one embodiment, boundary element BE2 (and any other boundary elements for which no cell state changes are detected) does not wake during this simulation time step. Of course, in other embodiments, each boundary element, including boundary elements for which no cell state changes are detected, can be simulated during each simulation time step.

In this manner, SOFA modeling of memory arrays can be used to significantly reduce SPICE simulation runtime and memory usage without degrading simulation accuracy. Note that the various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for analyzing a circuit including a memory array, the memory array comprising a plurality of array terminals interconnected with a plurality of memory cells, the method comprising defining a SPICE model for the circuit, wherein defining the SPICE model comprises:
    defining a set of state variables for each of the plurality of array terminals; and
    defining a plurality of boundary elements,
    wherein each of the plurality of boundary elements is associated with one of the plurality of array terminals, and
    wherein defining the plurality of boundary elements comprises defining a tallying equation set for each of the plurality of boundary elements for tracking a distribution of cell states for the memory cells connected to the array terminal associated with the each of the plurality of boundary elements.

2. The method of claim 1, further comprising running a SPICE simulation on the SPICE model, wherein running the SPICE simulation comprises generating a set of state values for the set of state variables for one or more of the plurality of array terminals, wherein generating the set of state values comprises:
    selecting one of the plurality of boundary elements;

adjusting the distribution of cell states for the one of the plurality of boundary elements in response to a set of cell state changes for the memory cells connected to the array terminal associated with the one of the plurality of boundary elements;

solving a set of model equations using a SPICE engine for each cell state in the distribution of cell states for the one of the plurality of boundary elements to generate a set of cell state results; and calculating the set of state values based on the set of cell state results and the distribution of cell states for the one of the plurality of boundary elements.

3. The method of claim 2, wherein generating the set of state values further comprises repeating the steps of selecting one of the plurality of boundary elements, adjusting the distribution of cell states, solving the set of model equations, and calculating the set of state values for each of the plurality of boundary elements.

4. The method of claim 2, wherein generating the set of state values further comprises repeating the steps of selecting one of the plurality of boundary elements, adjusting the distribution of cell states, solving the set of model equations, and calculating the set of state values for each of the plurality of boundary elements for which cell state changes are indicated.

5. The method of claim 2, wherein adjusting the distribution of cell states comprises defining a new set of model equations for a first cell state if the first set of cell state changes indicates that the first cell state is a new cell state among the memory cells connected to the array terminal associated with the first one of the plurality of boundary elements; and eliminating an existing set of model equations for a second cell state if the first set of cell state changes indicates that none of the memory cells connected to the array terminal associated with the first boundary element exhibit the second cell state.

6. The method of claim 2, wherein calculating the set of state values comprises:

identifying a quantity for one of the set of cell state results from the distribution of cell states;

multiplying the one of the set of cell state results by the quantity;

repeating the steps of identifying and multiplying to generate a set of products; and adding the set of products to generate one or more values in the set of state values.

7. The method of claim 6, wherein the one or more values includes at least one of a voltage value and a current value.

8. The method of claim 2, wherein solving the set of model equations comprises providing the set of model equations to a SPICE engine.

9. A software tool for performing a SPICE simulation on a circuit design, wherein the circuit design includes a memory array comprising a plurality of array terminals interconnected with a plurality of memory cells, the software tool comprising:

instructions for causing a computer system to define a set of state variables for each of the plurality of array terminals;

instructions for causing the computer system to define a plurality of boundary elements, wherein each boundary element is associated with one of the plurality of array terminals, and wherein each boundary element comprises instructions for causing the computer system to track a cell state distribution for the memory cells connected to the array terminal associated with the each boundary element.

10. The software tool of claim 9, wherein each boundary element further comprises instructions for causing the computer system to define a set of model equations for cell states in the cell state distribution.

11. The software tool of claim 10, wherein the instructions for causing the computer system to track the cell state distribution comprises instructions for causing the computer system to eliminate cell states in the cell state distribution that exhibit a zero quantity.

12. The software tool of claim 10, wherein the instructions for causing the computer system to define the set of model equations comprises instructions for causing the computer system to define model equations for only cell states in the cell state distribution that exhibit a non-zero quantity.

13. The software tool of claim 10, wherein the instructions for causing the computer system to define the set of model equations comprises instructions for causing the computer system to eliminate model equations for cell states that do not exhibit a non-zero quantity in the cell state distribution.

14. The software tool of claim 10, further comprising:

a SPICE engine; and instructions for causing the computer system to generate a set of cell state results by providing the cell states in the cell state distribution to the SPICE engine;

instructions for causing the computer system to generate a set of state values from the set of cell state results and the cell state distribution; and instructions for assigning the set of set values to the set of state variables for the array terminal associated with the each boundary element.

15. The software tool of claim 14, wherein the instructions for causing the computer system to generate the set of state values comprises instructions for causing the computer system to multiply the set of cell state results by the cell state distribution and sum the results to generate the set of state values.

16. The software tool of claim 15, wherein the instructions for causing the computer system to multiply the set of cell state results by the cell state distribution and sum the results comprises:

instructions for causing the computer system to multiply each voltage value and each current value from the set of cell state results by a corresponding cell state quantity from the cell state distribution to generate a set of voltage values and a set of current values, respectively;

instructions for causing the computer system to add the set of voltage values together to generate a state voltage value for the array terminal associated with the each boundary element; and instructions for causing the computer system to add the set of current values together to generate a state current value for the array terminal associated with the each boundary element.

17. A method for performing a SPICE simulation on a circuit design, the circuit design including a memory array comprising a plurality of array terminals interconnected with a plurality of memory cells, the method comprising generating state values for each of the plurality of array terminals based on a cell state distribution for the memory cells connected to the each of the plurality of array terminals without modeling all of the memory cells connected to the each of the plurality of array terminals.

18. The method of claim 17, wherein generating the state values comprises:

solving a set of model equations for each unique cell state exhibited by the memory cells connected to the each of the plurality of array terminals to generate a set of cell state values;

multiplying each of the set of cell state values by a corresponding quantity from the cell state distribution to generate a set of scaled cell state values; and adding a first subset of the set of scaled cell state values to generate a first state value for the each of the plurality of array terminals.

19. The method of claim 18, wherein all of the first subset of the set of scaled cell state values are one of voltage values and current values.

20. The method of claim 17, further comprising maintaining the cell state distribution, wherein maintaining the cell state distribution comprises:

adding a new cell state that does not exist in the cell state distribution to the cell state distribution when at least one of the memory cells connected to the each of the plurality of array terminals enters the new cell state; and removing an existing cell state from the cell state distribution when none of the memory cells connected to the each of the plurality of array terminals exhibits the existing cell state.

21. A memory cell array model usable in SPICE, the memory cell array model comprising:

a plurality of boundary elements, each boundary element associated with one terminal of a memory cell array and representing at least one value associated with memory cells connected to the terminal, the terminal being associated with one of a bit line and a word line of the memory cell array.

* * * * *